(12) United States Patent
Park et al.

(10) Patent No.: US 7,985,645 B2
(45) Date of Patent: Jul. 26, 2011

(54) SEMICONDUCTOR DEVICE HAVING A HIGH ASPECT CYLINDRICAL CAPACITOR AND METHOD FOR FABRICATING THE SAME

(75) Inventors: Cheol Hwan Park, Gyeonggi-do (KR); Ho Jin Cho, Gyeonggi-do (KR); Dong Kyun Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/649,610

(22) Filed: Dec. 30, 2009

(65) Prior Publication Data

US 2010/0327410 A1    Dec. 30, 2010

(30) Foreign Application Priority Data

Jun. 30, 2009  (KR) .................. 10-2009-0059510

(51) Int. Cl.
*H01L 21/8242* (2006.01)
(52) U.S. Cl. .. 438/253; 438/254; 438/396; 257/E21.648
(58) Field of Classification Search .................. 438/253, 438/254, 369, 397; 257/E21.648
See application file for complete search history.

(56) References Cited

U.S. PATENT DOCUMENTS

| 7,572,711 B2 * | 8/2009 | Park et al. ..................... 438/396 |
| 7,871,891 B2 | 1/2011 | Cho et al. |

FOREIGN PATENT DOCUMENTS

KR    1020050067483 A    7/2005

* cited by examiner

*Primary Examiner* — Hoai v Pham
(74) *Attorney, Agent, or Firm* — Ladas & Parry LLP

(57) ABSTRACT

A semiconductor device having a high aspect cylindrical capacitor and a method for fabricating the same is presented. The high aspect cylindrical type capacitor is a stable structure which is not prone to causing bunker defects and losses in a guard ring. The semiconductor device includes the cylindrical type capacitor structure, a storage node oxide, a guard ring hole, a conductive layer, and a capping oxide. The cylindrical type capacitor structure in a cell region includes a cylindrical type lower electrode, a dielectric and an upper electrode. The storage node oxide is in a peripheral region over the semiconductor substrate. The conductive layer coating the guard ring hole. The guard ring hole at a boundary of the peripheral region that adjoins the cell region over the semiconductor substrate. The capping oxide partially fills in a part of the conductive layer. The gapfill film filling in the rest of the conductive layer.

15 Claims, 5 Drawing Sheets

SEMICONDUCTOR DEVICE HAVING A HIGH ASPECT CYLINDRICAL CAPACITOR AND METHOD FOR FABRICATING THE SAME

CROSS-REFERENCE TO RELATED APPLICATION

The priority of Korean patent application No. 10-2009-59510 filed on 30 Jun. 2009, which is incorporated by reference in its entirety.

BACKGROUND OF THE INVENTION

1. Field of the Invention

The present invention relates to semiconductor fabrication techniques, more particularly, to a semiconductor device having a cylindrical type capacitor and a method for fabricating the same.

2. Background of the Invention

Recent trends towards reducing the minimum critical dimension and achieving higher degrees of integration in semiconductor devices have resulted in reducing the unit cell areas and therefore resulted in reducing the available area for a cell capacitor. No matter how small the area for a cell capacitor can be, a capacitance required for a unit cell still needs to be ensured in the capacitor within a cell. Therefore, a number of methods have been proposed to form a capacitor having a high capacitance within the limited available area. Among these methods are technique for developing a high-k dielectric to secure a high capacitance, and methods for stably forming capacitors that do not cause defects in a semiconductor device when these capacitors have large aspect ratios. However, the formation stable capacitor structures in semiconductor devices with the demands of sub-50 nm design rules have been difficult.

In the art, a cylindrical type capacitor has been introduced to ensure a large capacitor area per unit cell, but an increase in the planar area according to a given design rule is limited. Therefore, the only way to ensure a desired capacitance has been to increase the height of a capacitor.

In case of increasing the height of such a cylindrical type capacitor, a step (or level) difference between the cell region and the peripheral region after the formation of an upper electrode gets larger which requires the deposition of a relatively thick interlayer dielectric. However, during a subsequent planarization process such as CMP (chemical mechanical polishing), the cylindrical capacitor is subjected to undesirable stresses due to the large thicknesses of the interlayer dielectric which makes the cylindrical capacitor prone to cracking. Also, a cylindrical capacitor structure where only the cell region undergoes the dip-out process has been adopted to reduce a CD (critical dimension) bias during the formation of a metal plug. Considering that a step difference between the cell region and the peripheral region gets smaller after the dip-out process on the cell region, it is possible to reduce the overlap between a cell mat and an upper capacitor electrode, thereby achieving a net die increase.

According to the conventional technique described above, to dip out only the cell region, a guard ring is needed to be formed at the boundary of the peripheral region which adjoins to the cell region so as to protect a storage node oxide in the peripheral region when removing the storage node oxide. That is, the storage node oxide in the peripheral region should not be removed during the removal of the storage node oxide. However, if the structure is weak to any extent at all (e.g., the guard ring formed at the boundary of the peripheral region adjoined to the cell region has a defect), cracks can be formed therein or lifting may occur at the interface between the guard ring and the support film. As a result thereof, the storage node oxide in the peripheral region is not protected and an oxide etchant during the wet dip-out process permeates into the weak part, thereby bringing damage to the storage node oxide film. Such a defect is called a bunker defect.

FIG. 1a and FIG. 1b illustrate the occurrence of a defect during the formation of a cylindrical type capacitor according to the art. As shown in FIG. 1a, when a defect occurs in the guard ring formed at the boundary of the peripheral region adjoined to the cell region, the etchant can permeate during the wet dip-out process which can damage the storage node oxide as shown in the portion indicated within the dotted line.

Therefore, when the storage node oxide is damaged as described above, a metal contact which contacts both the top of the upper electrode and the bit lines during the subsequent multi level metal (MLM) formation process experiences a short, which in turn causes a defective operation of the semiconductor device and further reduces the yield of the semiconductor devices.

BRIEF SUMMARY OF THE INVENTION

Various embodiments of the present invention are directed to providing a semiconductor device and a method for fabricating the same, the semiconductor device being capable of protecting against damage to a storage node oxide in the peripheral region caused by the presence of a crack in the guard ring by a wet etchant or caused by an attack to the interface between the storage node oxide and a support film during the wet dip-out process as well as preventing the occurrence of a defect by forming a stable structure for the guard ring, and a method for fabricating the same. In particular, the present invention is directed to providing a semiconductor device and a method for fabricating the same, wherein the semiconductor device implements a cylindrical type capacitor having a stable structure by filling the inside of the guard ring with a gapfill film having a selectivity against the wet etchant to protect against a bunker defect or damage in the guard ring The semiconductor device fabrication method comprises: depositing a storage node oxide and a support film over a semiconductor substrate having a cell region and a peripheral region defined thereon; etching the support film and the storage node oxide in order to form a multiplicity of storage node holes in the cell region and a guard ring hole in the peripheral region; forming a multiplicity of cylindrical type lower electrodes in the storage node hole and at the same time forming a conductive layer in the guard ring hole; depositing a capping oxide for filling all of the storage node hole and for filling a part of the guard ring hole; depositing a gapfill film for filling the rest part of the guard ring hole; separating the multiplicity of lower electrodes from the cell region; patterning the support film to remove the support film within the cell region; and performing a wet dip-out process to remove the storage node oxide within the cell region so as to form a cylindrical type lower electrode.

Preferably, the method further comprises: forming a dielectric over the cylindrical type lower electrode; and forming an upper electrode over the dielectric.

Preferably, the storage node oxide comprises a single layer film selected from the group consisting of PSG, BSG, BPSG, USG and TEOS, or a multilayer film thereof.

Preferably, the support film has a higher selectivity against removal by the wet dip-out process as opposed to the storage node oxide.

Preferably, the support film comprises one selected from Si$_3$N$_4$, SiON and Si.

Preferably, the guard ring hole is larger than the storage node hole.

Preferably, the guard ring hole is larger than the storage node hole at least by about 10 nm.

Preferably, the lower electrode comprises TiN, TaN, WN, Pt, Ru or AlN or a laminate thereof, or a film comprising the materials coupled with Si, C, Al and Ge.

Preferably, the capping oxide comprises a low-temperature silicon oxide, PSG-based film or USG-based film.

Preferably, the low-temperature silicon oxide includes a SiO$_2$ film obtained by adding O$_3$ to TDMAS or an ALD SiO$_2$ film obtained by adding pyridine to HCD.

Preferably, the capping oxide film is formed in a range of room temperature to about 400° C.

Preferably, the deposition of the capping oxide comprises: depositing the capping oxide to cover the lower electrode and conductive layer; and performing a wet cleaning process to remove the capping oxide up to a predetermined upper portion of the conductive layer.

Preferably, the wet cleaning process uses a HF or BOE-buffered oxide etchant.

Preferably, the gapfill film has a higher etch selectivity against removal by the wet dip-out process as opposed to the storage node oxide.

Preferably, the gapfill film comprises a metallic film selected from the group consisting of TiN, TaN, WN, Pt, Ru, TiSiN, TiSiCN, TiCN and TiAlN, or a silicon-based film selected from the group consisting of Si$_3$N$_4$, SiON, SiBN, Si and SiGe.

Preferably, the lower electrode and the gapfill film are made of the same material.

Preferably, the lower electrode comprises a TiN film. Preferably, the gapfill film comprises a TiN film or a Si$_3$N$_4$ film.

Preferably, the separation of the storage node is achieved by a CMP or etch-back process.

Preferably, the support film is patterned to a hole type or a line type.

Preferably, the wet dip-out process is carried out by using a single type or batch type wet cleaning device.

Preferably, the wet dip-out process uses a BOE-buffered oxide etchant.

Preferably, the wet dip-out process is carried out with a Cleaning R, Cleaning N, FRD or FPM cleaning process in situ or ex situ.

Preferably, the dielectric is formed of Al$_2$O$_3$, ZrO$_2$, HfO$_2$, Ta$_2$O$_5$, TiO$_2$, STO (Strontium Titanate), BST (Barium Strontium Titanate), PZT (Lead Zirconate Titanate), etc. or of a multilayer film thereof.

Preferably, the upper electrode is formed of either TiN, TaN, W/WN, WN, Pt, Ru or AlN, or a laminate thereof.

Preferably, the formation of the upper electrode over the dielectric comprises removing the support film in the peripheral region.

The cylindrical type capacitor structure formed in a cell region over a semiconductor substrate, the structure including a cylindrical type lower electrode, a dielectric and an upper electrode; a storage node oxide formed in a peripheral region over the semiconductor substrate; a guard ring formed at the boundary of the peripheral region adjoined to the cell region over the semiconductor substrate; a guard ring formed in the guard ring hole; and a capping oxide for filling a part of the guard ring and a gapfill film for filling the rest part thereof.

DESCRIPTION OF EMBODIMENTS

Hereinafter, exemplary embodiments of the invention are described in detail with reference to accompanying drawings so that those skilled in the field to which the invention pertains to will be able to easily practice the technical aspect of the invention.

The present invention relates to a method for forming a cylindrical type MIM (metal insulator metal) capacitor, performing a dip-out process only on the cell region in a semiconductor device. In particular, the present invention relates to a method for fabricating a semiconductor device, wherein after forming a hole in a storage node (lower electrode) hole and depositing the lower electrode, the inside of the hole of a guard ring is filled with a gapfill film so that the occurrence of a bunker defect and damage at the time of the wet dip-out process caused by a thin thickness of the guard ring can be protected against to thus avoid damage to a storage node oxide in the peripheral region during the wet dip-out process.

FIG. 2a to FIG. 2h each illustrate some of the more important process sectional view describing a method for fabricating a semiconductor device having a cylindrical type capacitor according to an exemplary embodiment of the present invention. It is understood herein that the drawings are not necessarily to scale and in some instances proportions may have been exaggerated in order to more clearly depict certain features of the invention.

Figure 1A:
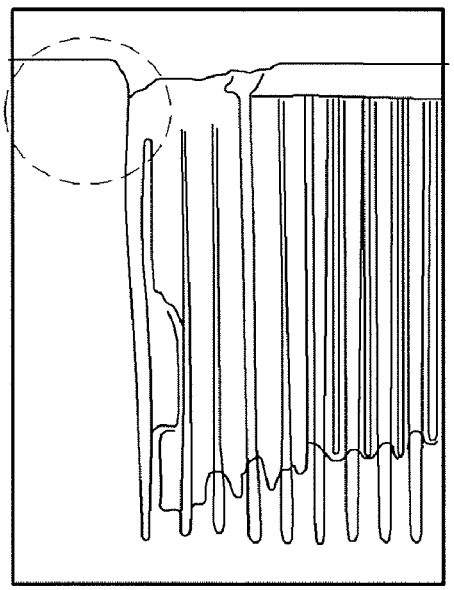
FIG. 1a and FIG. 1b illustrate the occurrence of a defect during the formation of a cylindrical type capacitor according to the art.
Figure 1B:
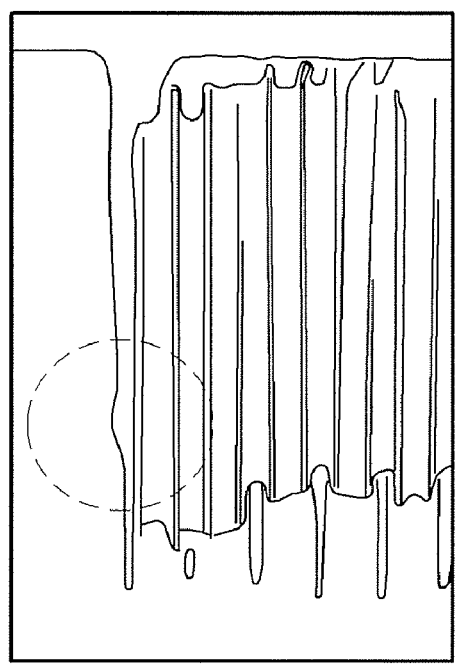
Figure 2A:
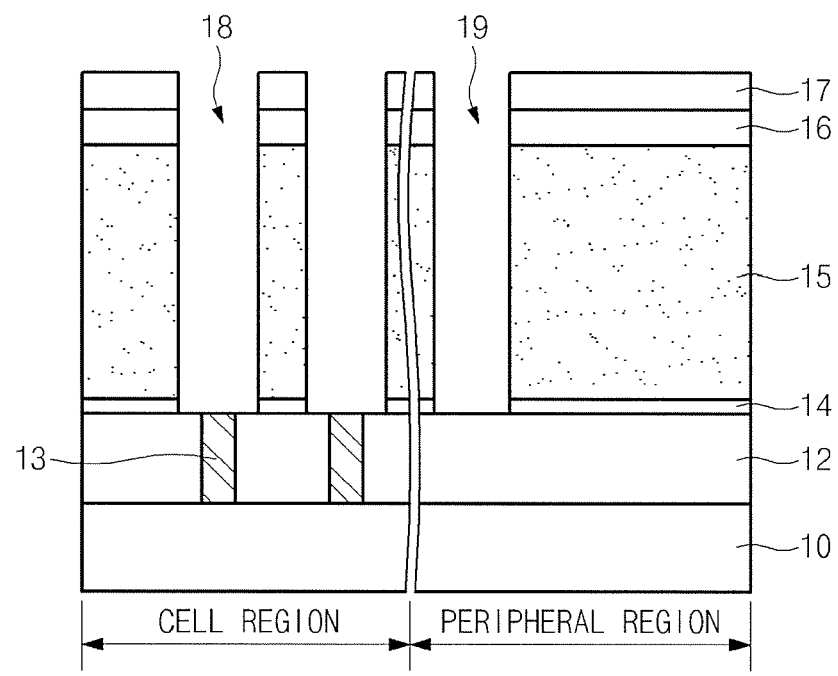
FIG. 2a to FIG. 2h each illustrate a process sectional view describing a method for fabricating a semiconductor device having a cylindrical type capacitor according to an exemplary embodiment of the present invention.

Referring to FIG. 2a, a first interlayer dielectric 12 is formed over a semiconductor substrate 10 having a cell region and a peripheral region defined thereon, and then a predetermined portion of this interlayer dielectric 12 corresponding to the cell region is etched to form a contact hole for exposing a part of the semiconductor substrate 10. The contact hole is filled with polysilicon to form a storage node contact plug 13. At this time, a series of predetermined processes associated with the fabrication of a semiconductor device, may proceed prior to the formation of the interlayer dielectric 12. For example, an isolation layer, word lines, first interlayer dielectric and bit lines may be formed in order, or source/drain of a transistor may be formed in the semiconductor substrate 10.

Next, on the resulting structure including the interlayer dielectric 12 and the storage node contact plug 13 are deposited, in order, a storage node lower stop layer 14 as an etch-stop layer, a first storage node oxide 15, a support film 16, a second storage node oxide 17 and the like. Here, the storage node oxides 15 and 17 are formed of a single layer film made from PSG (phosphorsilicate glass), BSG (boro-silicate glass), BPSG (borophosphorsilicate glass), USG (undoped silicate glass), TEOS (tetraethyl orthosilicate), etc. or a multilayer film thereof. Also, the support film 16 is formed using an insulator having a high selectivity against removal by a subsequent wet dip-out process as opposed to the storage node oxide, and the support film 16 includes a silicon-based film such as Si$_3$N$_4$, SiON, Si, etc. The support film 16 is adopted to prevent leaning between the lower electrodes and between the lower electrodes and the guard ring.

Next, the mask and etching processes proceed to form a storage node hole 18 in the cell region to form a lower electrode of the capacitor. When the storage node hole 18 is formed, a guard ring hole 19 is also formed at the boundary of the peripheral region adjoined to the cell region. Here, the guard ring hole 19 is preferred to have a width substantially larger than that of the storage node hole 18, preferably being larger than the storage node hole 18 at least by approximately 10 nm.

Figure 2B:
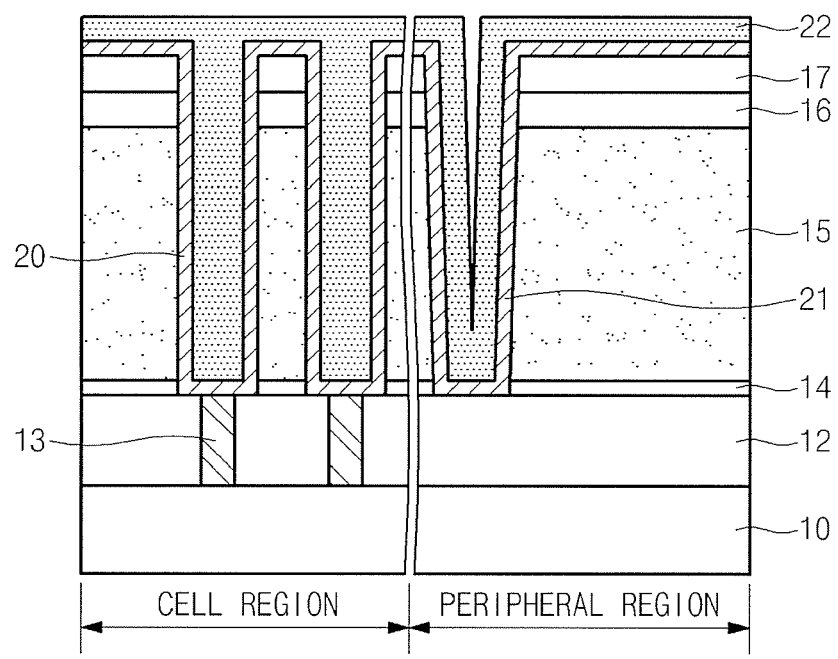

Referring now to FIG. 2b, in order to make an ohmic contact with the storage node contact plug 13 being exposed by the storage node hole 18, a Ti film for example is deposited over the storage node contact plug 13 to form a TiSi film (not shown).

On the whole surface of the resulting structure including the storage node hole 18 is deposited a lower electrode 20. At this time, a cylindrical type conductive layer 21 is also formed inside the guard ring hole 19. The lower electrode 20 is made of TiN, TaN, WN, Pt, Ru or AlN, or a laminate thereof, or a film made of the aforementioned materials coupled with Si, C, Al, Ge, etc., or preferably a TiN film.

On the resulting structure having the lower electrode 20 formed thereon is deposited with a capping oxide 22 that fills in the inside of the storage node hole 18. Since the guard ring hole 19 is wider than the storage node hole 18, only a part of the guard ring hole 19 is filled with the capping oxide 22 and an area from the top to a certain part is not filled. That is, the capping oxide 22 is in the form of a continuous film, while sufficiently filling the storage node hole 18 having the lower electrode 20 formed thereover; and is coated in the form of a non-continuous film, while filling only a part of the guard ring hole 19 having the conductive layer 21 formed thereover. This occurs because the storage node hole 18 and the guard ring hole 19 have a different width from each other.

Here, the capping oxide 22 is formed of a low-temperature silicon oxide, PSG-based film, USG-based film, etc. Examples of the low-temperature silicon oxide include $SiO_2$ film obtained by adding $O_3$ to TDMAS (tris(dimethylamino) silane), ALD $SiO_2$ film (ALD referring to an atomic layer deposition technique) obtained by adding pyridine to HCD and the like. The capping oxide 22 filling the entire space within the storage node hole 18 serves to protect against the lower electrode from being attacked in a subsequent process. The capping oxide 22 is preferably formed at a low temperature in a range of room temperature to about 400° C. to minimize oxidation of the lower electrode 20.

Figure 2C:
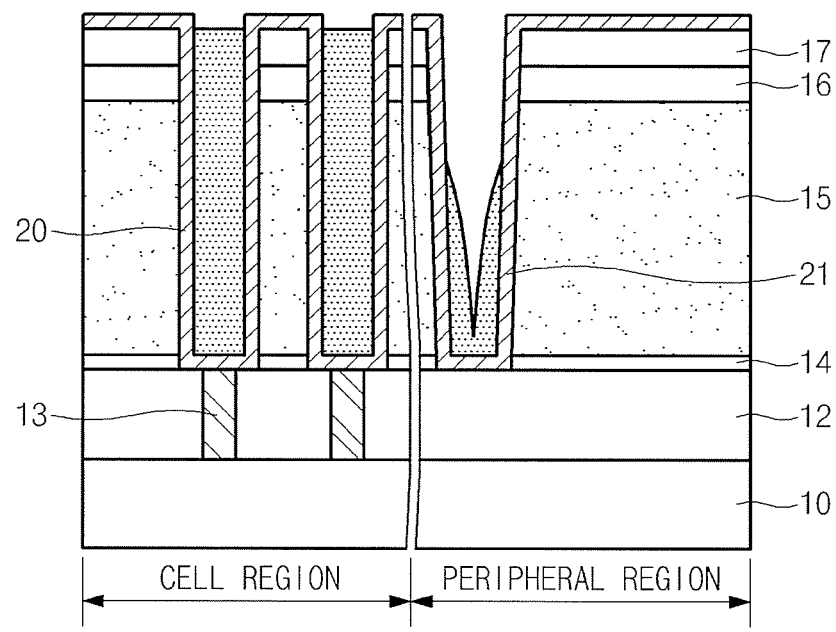

Referring next to FIG. 2c, a wet cleaning process using a HF or BOE-based etchant is carried out to remove a certain portion of the capping oxide 22, depending on its deposition thickness. At this time, the capping oxide 22 that corresponds to the top portion of the conductive layer 21 is removed, and the capping oxide 22 that corresponds to the bottom portion of the conductive layer 21 remains.

Figure 2D:
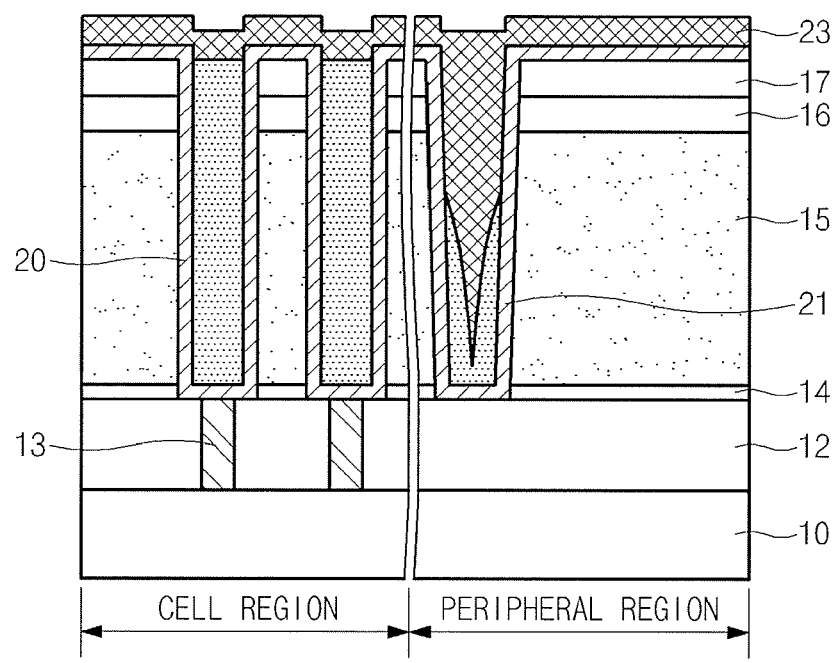

Referring to FIG. 2d, on the whole surface of the resulting structure having a predetermined portion of the capping oxide 22 been removed therefrom, a gapfill film 23 is deposited to fill in the other portions of the storage node hole 18 and/or guard ring hole 19 that are not filled in with the capping oxide 22. Examples of the gapfill film 23 include a metallic film such as TiN, TaN, WN, Pt, Ru, TiSiN, TaSiN, TiSiCN, TiCN, TiAlN or the like, or a silicon-based film such as $Si_3N_4$, SiON, SiBN, Si, SiGe or the like, but the same material as that of the lower electrode 20 is preferably used. In case of using a TiN film for the lower electrode 20, a TiN film or a $Si_3N_4$ film is preferably used for the gapfill film 23. Such a gapfill film 23 has a high etch selectivity against removal by a subsequent wet dip-out process as opposed to the capping oxide 22.

Figure 2E:
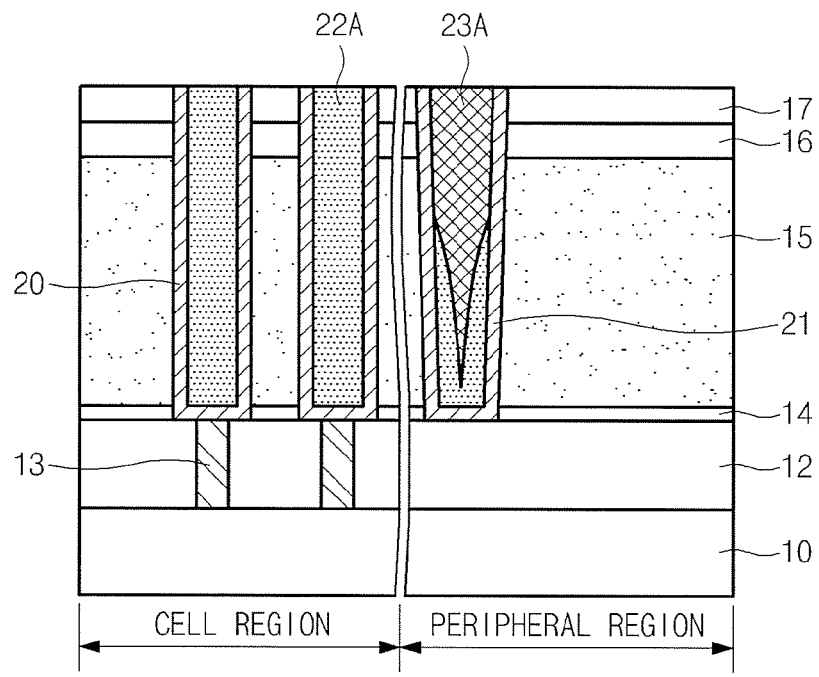

Referring now to FIG. 2e, the storage node is isolated by performing a planarization process using either a CMP or an etch-back process. At this time, the gapfill film 23 being deposited the storage node and conductive layer is removed until the top surface of the second storage node oxide 17 is exposed. According to this embodiment, because of the planarization process, the guard ring hole 19 where a part of the capping oxide remains is fully filled in with the gapfill film 23A, and the storage node hole 18 is fully filled with the capping oxide 22A. As a result, a guard ring comprising the conductive layer 21, a part of capping oxide 22 and gapfill film 23A is formed.

Figure 2F:
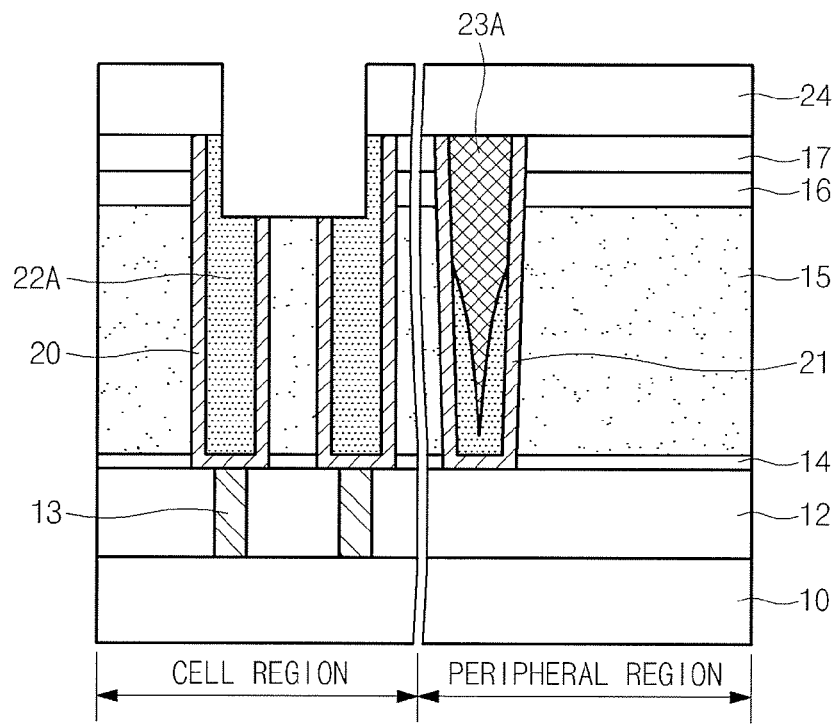

Referring to FIG. 2f, the whole surface of the resulting structure having the top surface of the second storage node oxide 17 been exposed is coated with a photoresist film, and then patterned by the exposure and development to form a mask 24 which opens the part of the cell region and covers the peripheral region. Next, the second storage node oxide 17 in the cell region, having been exposed by the mask 24, is removed, and an etching process for removing the support film 16 in a particular shape is then carried out. Here, the type of patterning for the support film is not limited to any particular kinds, but includes a hole type, a line type and the like.

Figure 2G:
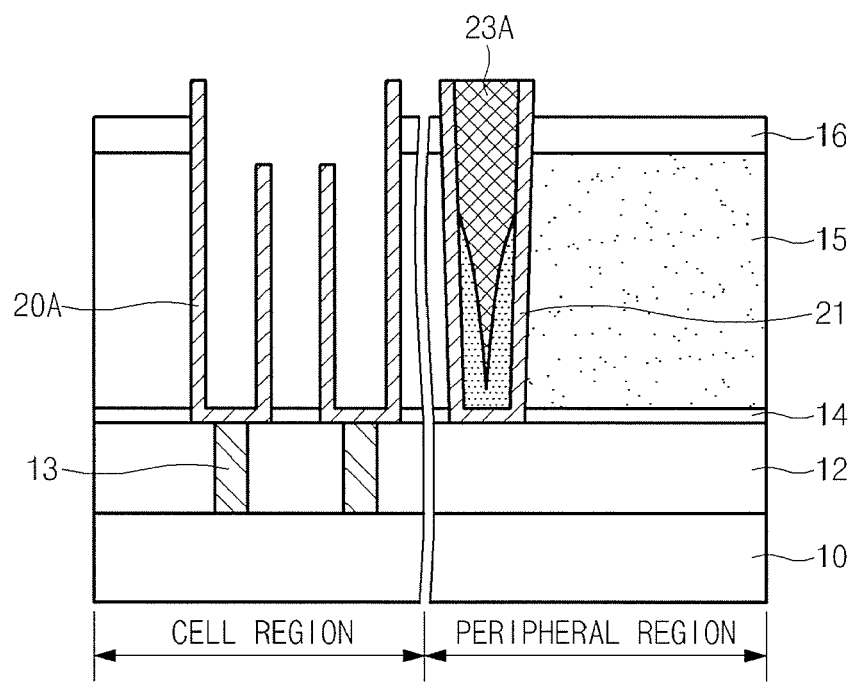

Referring to FIG. 2g, the mask 24 is stripped, followed by a wet dip-out cleaning process using an oxide etchant to remove the storage oxide outside the lower electrode 20A, i.e., the first and second storage oxides 15 and 17 and the remaining capping oxide A (see FIG. 2f), to form a cylindrical type lower electrode 20A. At this time, the conductive layer remains filled in with the gapfill film 23A which has an etch selectivity against removal by the wet etchant as opposed to the storage node oxide in order to minimize the loss thereof. The wet dip-out cleaning process is carried out with a single-type or batch-type wet cleaning device. The wet dip-out cleaning process uses a BOE-based material as the oxide etchant, and if necessary to reduce the loss of the lower electrode 20, cleaning using Cleaning R (solution of $H_2SO_4$ and $H_2O_2$), Cleaning N (solution of $NH_4OH$, $H_2O_2$ and $H_2O$), FRD (fluorine rinse dry) or FPM (hydroflouric peroxide mixture) is advantageously carried out in situ or ex situ, to double the dip-out and particle removal capabilities.

Figure 2H:
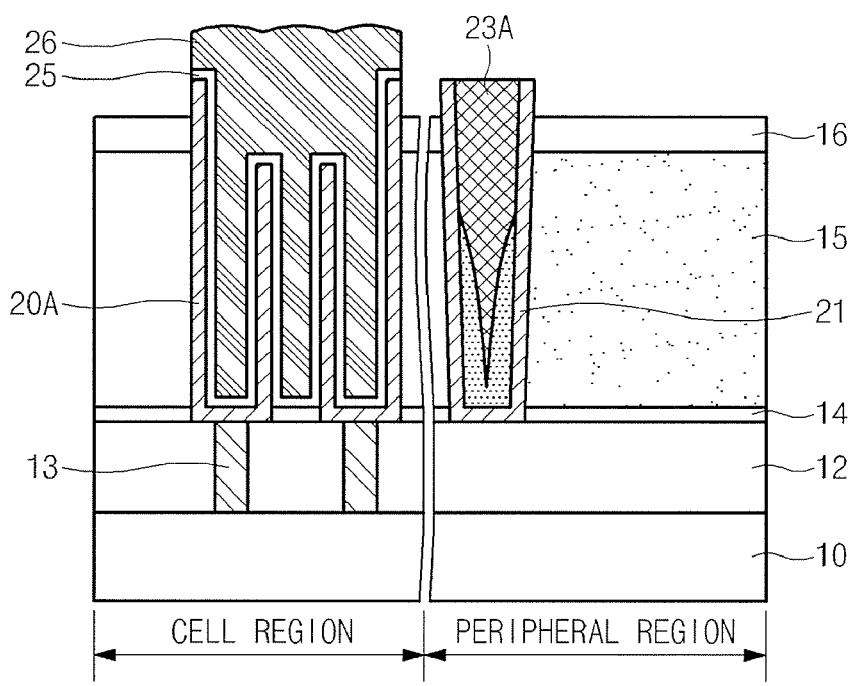

Referring next to FIG. 2h, a dielectric 25 is formed on the whole surface of the resulting structure having the cylindrical type lower electrode 20A on the top thereof. Here, the dielectric 25 is formed of a single layer film of a material having a high permittivity, for example, $Al_2O_3$, $ZrO_2$, $HfO_2$, $Ta_2O_5$, $TiO_2$, STO, BST, PZT, etc. or of a multilayer film thereof, and can be obtained by CMP or ALD.

On this dielectric 25 an upper electrode 26 is then formed of TiN, TaN, W/WN, WN, Pt, Ru or AlN, or a laminate thereof.

Next, a capping material is deposited over the upper electrode 26, and the patterning and etching of the upper electrode 26 proceeds to separate a cell region and a peripheral region. At this time, the support film 16 in the peripheral region is also removed as well.

In addition to the above-described method, the present invention can also be applied to the fabrication of a capacitor, which involves a series of processes, i.e. performing the patterning and etching processes for removing the support film, forming an additional storage node oxide, and patterning and etching the storage node hole.

As explained so far, the present invention makes it possible to form a cylindrical capacitor having a stable structure without causing a bunker defect and loss in a guard ring, by filling the guard ring hole formed at the boundary of the peripheral region adjoined to the cell region with a gapfill film.

In the fabrication process of a capacitor having a MIM (metal insulator metal) structure of a semiconductor device, if only the cell region undergoes the dip-out process to form a capacitor, the guard ring located at the boundary of the peripheral region adjoined to the cell region is attached by a wet etchant during the wet dip-out process, thereby causing damage to the storage node oxide in the peripheral region. By filling this conductive layer with a gapfill film, the present invention protects against damage due to stress so as to prevent a bunker defect and damage to the guard ring. Accordingly, it is possible to provide a cylindrical type capacitor having a stable structure as well as a high-integration, high-quality semiconductor device.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor device, comprising:
    depositing a storage node oxide and a support film over a semiconductor substrate having a cell region and a peripheral region defined thereon;
    etching the support film and the storage node oxide to form a multiplicity of storage node holes in the cell region and a guard ring hole at the boundary of the peripheral region adjoined to the cell region;
    forming a multiplicity of cylindrical type lower electrodes within the storage node hole and at the same time forming a conductive layer within the guard ring hole;
    depositing a capping oxide that completely fills in the storage node hole and that partially fills in only a part of the guard ring hole;
    depositing a gapfill film for completely filling in a remaining part of the guard ring hole;
    separating the multiplicity of lower electrodes from the cell region;
    patterning the support film to remove the support film from within the cell region; and
    performing a wet dip-out process to remove the storage node oxide within the cell region to form a cylindrical type lower electrode.

2. The method of claim 1, further comprising:
    forming a dielectric over the cylindrical type lower electrode; and
    forming an upper electrode over the dielectric.

3. The method of claim 1, wherein the storage node oxide comprises a single layer film selected from the group consisting of PSG (phosphorsilicate glass), BSG (boro-silicate glass), BPSG (borophosphorsilicate glass), USG (undoped silicate glass), TEOS (tetraethyl orthosilicate), or a multilayer film thereof.

4. The method of claim 1, wherein the guard ring hole is larger than the storage node hole.

5. The method of claim 1, wherein the lower electrode is selected from the group consisting of TiN, TaN, WN, Pt, Ru, AlN or a laminate thereof.

6. The method of claim 1, wherein the capping oxide comprises a low-temperature silicon oxide, PSG-based (phosphorsilicate glass) film or USG-based (undoped silicate glass) film.

7. The method of claim 1, wherein the deposition of the capping oxide comprises:
    depositing the capping oxide to cover the lower electrode and conductive layer; and
    performing a wet cleaning process to remove the capping oxide up to a predetermined upper portion of the conductive layer.

8. The method of claim 1, wherein the gapfill film has an etch selectivity against removal by the wet dip-out process as opposed to the storage node oxide.

9. The method of claim 8, wherein the gapfill film comprises a metallic film or a silicon-based film, wherein the metallic film is selected from the group consisting of TiN, TaN, WN, Pt, Ru, TiSiN, TiSiCN, TiCN and TiAlN, wherein the silicon-based film is selected from the group consisting of $Si_3N_4$, SiON, SiBN, Si and SiGe.

10. The method of claim 1, wherein the wet dip-out process is performed by using a single type or batch type wet cleaning device.

11. The method of claim 1, wherein the wet dip-out process uses a BOE-buffered oxide etchant.

12. The method of claim 1, wherein the wet dip-out process is carried out together with a Cleaning N, Cleaning R, FRD or FPM cleaning process in situ or ex situ.

13. The method of claim 1, wherein the dielectric is selected from the group consisting of $Al_2O_3$, $ZrO_2$, $HfO_2$, $Ta_2O_5$, $TiO_2$, STO, BST or PZT, or a laminate thereof.

14. The method of claim 1, wherein the upper electrode is composed of the group consisting of TiN, TaN, W/WN, WN, Pt, Ru or AlN, or a laminate thereof.

15. The method of claim 1, wherein the formation of the upper electrode over the dielectric comprises removing the support film in the peripheral region.

* * * * *